US012763387B2

(12) United States Patent
Okabe

(10) Patent No.: US 12,763,387 B2
(45) Date of Patent: Oct. 13, 2026

(54) POWER STORAGE SYSTEM

(71) Applicant: HONDA MOTOR CO., LTD., Tokyo (JP)

(72) Inventor: Hiroto Okabe, Tokyo (JP)

(73) Assignee: HONDA MOTOR CO., LTD., Tokyo (JP)

(*) Notice: Subject to any disclaimer, the term of this patent is extended or adjusted under 35 U.S.C. 154(b) by 959 days.

(21) Appl. No.: 18/090,054

(22) Filed: Dec. 28, 2022

(65) Prior Publication Data

US 2023/0223608 A1 Jul. 13, 2023

(30) Foreign Application Priority Data

Jan. 11, 2022 (JP) ................................ 2022-002384

(51) Int. Cl.
*H02J 7/00* (2026.01)
*G01R 31/36* (2020.01)
(Continued)

(52) U.S. Cl.
CPC ........ *H01M 10/48* (2013.01); *G01R 31/3648* (2013.01); *G01R 31/389* (2019.01); *H01M 10/425* (2013.01); *H01M 2010/4271* (2013.01)

(58) Field of Classification Search
None
See application file for complete search history.

(56) References Cited

U.S. PATENT DOCUMENTS

2007/0145953 A1 6/2007 Asai et al.
2009/0266631 A1* 10/2009 Kikuchi ................ B60L 3/0046 180/65.265
(Continued)

FOREIGN PATENT DOCUMENTS

CN 103986121 A 8/2014
CN 104662770 A 5/2015
(Continued)

OTHER PUBLICATIONS

Nov. 29, 2023, Translation of Japanese Office Action issued for related JP Application No. 2022-002384.
(Continued)

*Primary Examiner* — Arun C Williams
(74) *Attorney, Agent, or Firm* — Paratus Law Group, PLLC

(57) ABSTRACT

A power storage system includes: a battery; a voltmeter; an ammeter; and processing circuitry. The processing circuitry functionally includes: a first calculation unit configured to calculate estimated internal resistance, which is an estimated value of present internal resistance, based on the voltage and the current; a second calculation unit configured to calculate charging power upper limit, based on the estimated internal resistance calculated by the first calculation unit, the present voltage, and the present current; a charge control unit configured to control charge of the battery to prevent charging power exceeding the charging power upper limit from being supplied to the battery; and a limitation unit configured to determine, based on the current, whether power fluctuation in which output power of the battery fluctuates greatly within a short period of time has occurred or not and to prohibit the second calculation unit from operating during the power fluctuation.

7 Claims, 2 Drawing Sheets

(51) Int. Cl.

| | |
|---|---|
| ***G01R 31/389*** | (2019.01) |
| ***H01M 10/42*** | (2006.01) |
| ***H01M 10/48*** | (2006.01) |

(56) References Cited

U.S. PATENT DOCUMENTS

| | | | |
|---|---|---|---|
| 2010/0079111 | A1 | 4/2010 | Masuda |
| 2012/0187899 | A1 | 7/2012 | Ozaki |
| 2014/0217934 | A1 | 8/2014 | Suzuki |
| 2015/0236523 | A1 | 8/2015 | Takano et al. |
| 2016/0131714 | A1 | 5/2016 | Kuusisto et al. |
| 2016/0233693 | A1 | 8/2016 | Suzuki |
| 2017/0019051 | A1* | 1/2017 | Fujie ....................... H02P 27/00 |

FOREIGN PATENT DOCUMENTS

| | | | |
|---|---|---|---|
| JP | 2007-147487 | A | 6/2007 |
| JP | 2010-281678 | A | 12/2010 |
| JP | 2012-157123 | A | 8/2012 |
| JP | 2012-200075 | A | 10/2012 |
| JP | 2015-119558 | A | 6/2015 |

OTHER PUBLICATIONS

Jun. 30, 2026, Translation of Chinese Office Action issued for related CN Application No. 202211679966.3.

* cited by examiner

POWER STORAGE SYSTEM

CROSS-REFERENCE TO RELATED APPLICATION

This application is based on and claims priority under 35 USC § 119 from Japanese Patent Application No. 2022-002384, filed on Jan. 11, 2022, the entire contents of which are incorporated herein by reference.

TECHNICAL FIELD

The present disclosure relates to a power storage system.

BACKGROUND

In recent years, as a specific countermeasure against global climate change, efforts for implementing a low-carbon society or a decarbonized society have been active. In vehicles such as automobiles, a reduction in $CO_2$ emission amount is strongly required, and electrification of a drive source is rapidly advancing. Specifically, development of vehicles (hereinafter, also referred to as "electrically driven vehicles") such as electrical vehicles or hybrid electrical vehicles, which include an electric motor as a drive source and a battery as a secondary battery capable of supplying electric power to the electric motor, is underway.

If charging power, which is power for charging a battery, is increased, the battery can be charged efficiently timewise. On the other hand, if the charging power is excessively supplied to the battery, deterioration of the battery may occur. Therefore, it is desirable to appropriately control the charging power. Similarly, it is desirable to appropriately control discharging power, which is power discharged from a battery, in order to maintain performance and reliability of the battery.

JP2015-119558A discloses that: reference voltage is calculated from voltage, current, and internal resistance of the power storage device; chargeable power is calculated from the reference voltage and modified internal resistance, which is predetermined such that it is larger than the internal resistance; and charging power is limited to the chargeable power when needed to be increased temporally.

There is, however, room for improvement to make it possible to appropriately control the charging or discharging power even if power fluctuation in which output power of a battery fluctuates greatly within a short period of time occurs.

An object of the present disclosure is to provide a power storage system capable of appropriately controlling the charging or discharging power even if the power fluctuation occurs.

SUMMARY

A power storage system according to an aspect of the present disclosure includes: a battery; a voltmeter configured to measure voltage of the battery; an ammeter configured to measure current of the battery; and processing circuitry. The processing circuitry functionally includes: a first calculation unit configured to calculate estimated internal resistance, which is an estimated value of present internal resistance of the battery, based on the voltage and the current; a second calculation unit configured to calculate charging power upper limit, which is an upper limit on charging power for the battery, based on the estimated internal resistance calculated by the first calculation unit, the present voltage, and the present current; a charge control unit configured to control charge of the battery to prevent charging power exceeding the charging power upper limit from being supplied to the battery; and a limitation unit configured to determine, based on the current, whether power fluctuation in which output power of the battery fluctuates greatly within a short period of time has occurred or not and to prohibit the second calculation unit from operating during the power fluctuation.

A power storage system according to another aspect of the present disclosure includes: a battery; a voltmeter configured to measure voltage of the battery; an ammeter configured to measure current of the battery; and processing circuitry. The processing circuitry functionally includes: a first calculation unit configured to calculate estimated internal resistance, which is an estimated value of present internal resistance of the battery, based on the voltage and the current; a second calculation unit configured to calculate discharging power upper limit, which is an upper limit on discharging power for the battery, based on the estimated internal resistance calculated by the first calculation unit, the present voltage, and the present current; a discharge control unit configured to control discharge of the battery to prevent discharging power exceeding the discharging power upper limit from being discharged from the battery; and a limitation unit configured to determine, based on the current, whether power fluctuation in which output power of the battery fluctuates greatly within a short period of time has occurred or not and to prohibit the second calculation unit from operating during the power fluctuation.

According to the present disclosure, there is provided a power storage system capable of appropriately controlling charging or discharging power even if the power fluctuation occurs.

BRIEF DESCRIPTION OF DRAWINGS

Exemplary embodiments of the present disclosure will be described in detail based on the following figures, wherein.

DESCRIPTION OF EMBODIMENTS

In the following, some embodiments of a power storage system of the present disclosure will be described in detail with reference to the drawings. Although examples will be described in which the power storage system of the present disclosure is a vehicular power storage system installed in a vehicle such as an automobile, the present disclosure is not limited thereto and can be applied to a variety of power storage systems. The same or similar elements are denoted by the same or similar reference signs, and a description thereof may be omitted or simplified as appropriate.

Vehicle

Figure 1:
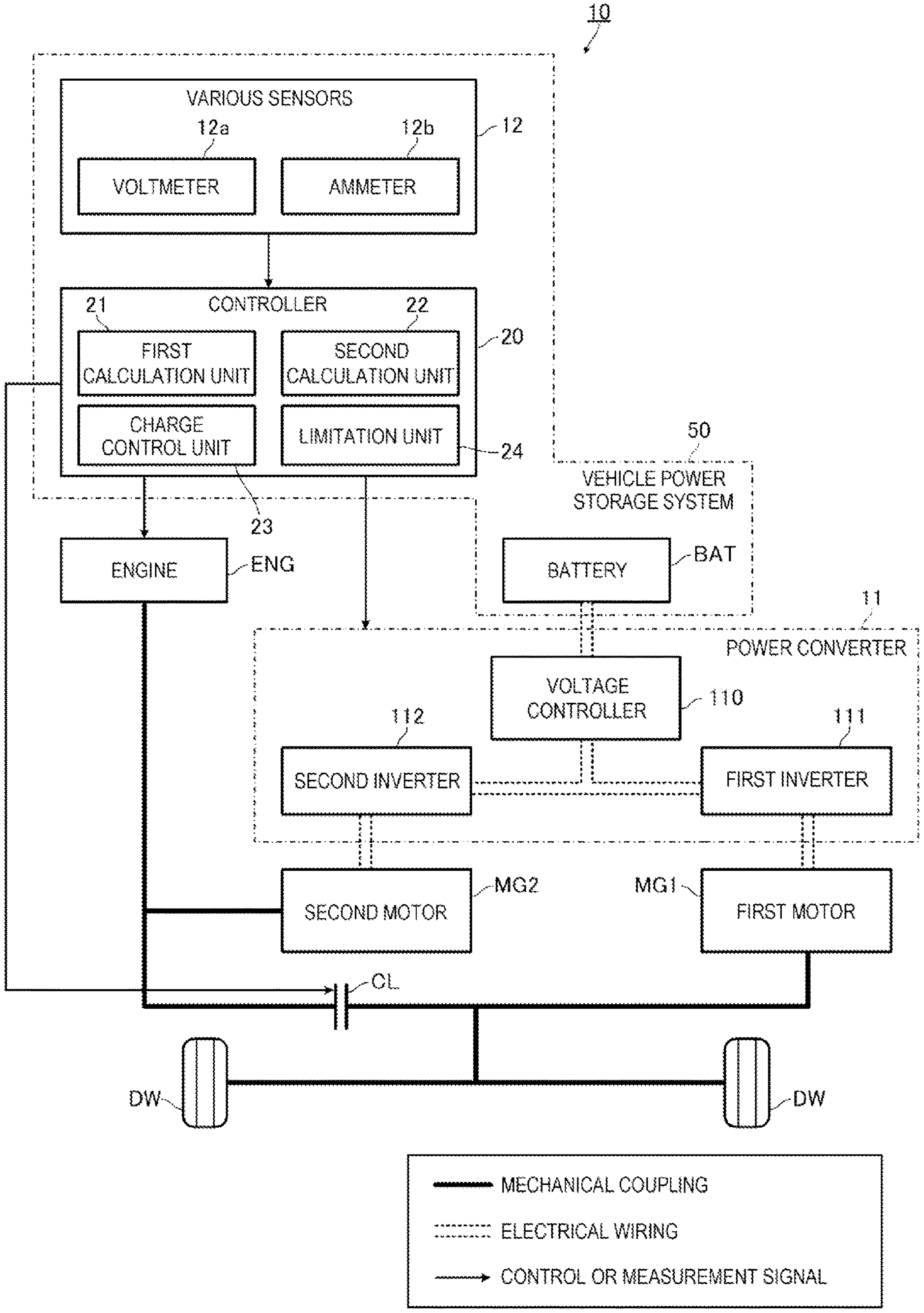
FIG. 1 shows a schematic configuration of a vehicle 10 in which a vehicle power storage system 50, which is an embodiment of a power storage system of the present disclosure, is installed.

First, a vehicle in which the vehicle power storage system of the present embodiment is installed will be described. As shown in FIG. 1, a vehicle 10, in which a vehicle power storage system 50 of the present embodiment is installed, is a hybrid electric vehicle and includes an engine ENG, a first motor MG1, a second motor MG2, a battery BAT, a clutch CL, a power converter 11, various sensors 12, and a controller 20. In FIG. 1, thick solid lines indicates mechanical coupling, double dotted lines indicate electrical wiring, and thin solid arrows indicate flow of control or measurement signals.

The engine ENG is, for example, a gasoline or diesel engine and is configured to output power generated by burning supplied fuel. The engine ENG is coupled to the second motor MG2 and to drive wheels DW of the vehicle 10 via the clutch CL. The power output from the engine ENG (hereinafter, also referred to as "output of the engine ENG") is transmitted to the second motor MG2 when the clutch CL is released and is transmitted to the second motor MG2 and the drive wheels DW when the clutch CL is engaged. The second motor MG2 and the clutch CL will be described later.

The first motor MG1 is a motor (drive motor) mainly used as a drive source of the vehicle 10 and is, for example, an AC motor. The first motor MG1 is electrically connected to the battery BAT and the second motor MG2 via the power converter 11. The first motor MG1 can be supplied with electric power from at least the battery BAT or the second motor MG2. The first motor MG1 is configured to operate as an electric motor to output power for the vehicle 10 to travel when the first motor MG1 is supplied with electric power. The first motor MG1 is coupled to the drive wheels DW, and power output from the first motor MG1 (hereinafter, also referred to as "output of the first motor MG1") is transmitted to the drive wheels DW. The vehicle 10 is configured to travel with at least the output of the engine ENG or the first motor MG1 transmitted (supplied) to the drive wheels DW.

The first motor MG1 is configured to output regenerated power (perform regeneration) when the brakes of the vehicle 10 is applied (and the first motor MG1 is rotated by the engine ENG or the drive wheels DW). The regenerated power is, for example, supplied to the battery BAT via the power converter 11. Accordingly, the battery BAT can be charged with the regenerated power.

The regenerated power does not have to be supplied to the battery BAT and may be supplied to the second motor MG2 via the power converter 11 for disposal in which the regenerated power is consumed without being used to charge the battery BAT. At the time of the disposal, the regenerated power supplied to the second motor MG2 drives the second motor MG2, the power generated by the second motor MG2 is transmitted to and consumed in the engine ENG due to mechanical friction loss and the like.

The second motor MG2 is a motor (power-generating motor) mainly used as a generator and is, for example, an AC motor. The second motor MG2 is configured to generate electric power with output of the engine ENG driving the second motor MG2. The electric power generated by the second motor MG2 is supplied to at least the battery BAT or the first motor MG1 via the power converter 11. If the electric power is supplied to the battery BAT, the battery BAT can be charged. If the electric power is supplied to the first motor MG1, the first motor MG1 can be driven thereby.

The power converter 11 is a device (power control unit PCU) configured to transform current and is connected to the first motor MG1, the second motor MG2, and the battery BAT. The power converter 11 includes, for example, a first inverter 111, a second inverter 112, and a voltage controller 110, which are electrically connected to one another.

The voltage controller 110 is configured to transform current and may be a DC-to-DC converter. For example, when the power of the battery BAT is supplied to the first motor MG1, the voltage controller 110 steps up the output voltage of the battery BAT and outputs it to the first inverter 111. For example, when regenerated power is output from the first motor MG1, the voltage controller 110 steps down the output voltage of the first motor MG1 received via the first inverter 111 and outputs it to the battery BAT. When electric power is generated by the second motor MG2, the voltage controller 110 steps down the output voltage of the second motor MG2 received via the second inverter 112 and outputs it to the battery BAT.

When the power of the battery BAT is supplied to the first motor MG1, the first inverter 111 converts direct current of the battery BAT received via the voltage controller 110 into alternating current and outputs it to the first motor MG1. When regenerated power is output from the first motor MG1, the first inverter 111 converts alternating current received from the first motor MG1 to direct current and outputs it to the voltage controller 110. When the regenerated power is disposed of, the first inverter 111 converts the alternating current received from the first motor MG1 into direct current and outputs it to the second inverter 112.

When the electric power is generated by the second motor MG2, the second inverter 112 converts alternating current received from the second motor MG2 into direct current and outputs it to the voltage controller 110. When the regenerated power is disposed of, the second inverter 112 converts direct current received from the first motor MG1 via the first inverter 111 into alternating current and outputs it to the second motor MG2.

The battery BAT is a secondary battery configured to charge and discharge and includes a plurality of cells connected in series or in series parallel. The terminal voltage of the battery BAT is a high voltage, such as 100-400 V. The cells of the battery BAT may be a lithium-ion battery, a nickel-metal hydride battery, or the like.

The clutch CL can be switched to two states: one is a connected state (engaged state), in which a power transmission path from the engine ENG to the drive wheels DW is formed by engaging the clutch CL; and the other is a disconnected state (released state), in which the power transmission path is disconnected by releasing the clutch CL. The output of the engine ENG is transmitted to the drive wheels DW when the clutch CL is in the connected state and is not transmitted to the drive wheels DW when the clutch CL is in the disconnected state.

The various sensors 12 include, for example, a vehicle speed sensor configured to measure the speed (also referred to as "vehicle speed") of the vehicle 10, an accelerator position (AP) sensor configured to track the position of (operational input onto) the accelerator pedal of the vehicle 10, a brake sensor configured to track the position of (operational input onto) the brake pedal of the vehicle 10, and battery sensors configured to correct a variety of information related to the battery BAT.

The battery sensors includes, for example, a voltmeter 12*a* configured to measure voltage V of the battery BAT, and an ammeter 12*b* configured to measure current I of the battery BAT. The voltmeter 12*a* is configured to measure closed circuit voltage of the battery BAT as the voltage V of the battery BAT. The ammeter 12*b* is configured to measure input/output current of the battery BAT as the current I of the battery BAT. In the present embodiment, the current I of the battery BAT becomes a positive value when the battery BAT is discharged and becomes a negative value when the battery BAT is charged.

Output signals from the various sensors 12 including the voltmeter 12*a* and the ammeter 12*b* are transmitted to the controller 20. In addition to the voltmeter 12*a* and the ammeter 12*b*, the various sensors 12 may include (as a battery sensor) a temperature sensor configured to measure the temperature of the battery BAT.

The controller 20 is configured to communicate with the engine ENG, the clutch CL, the power converter 11, and the various sensors 12. The controller 20 is configured to control, for example, the output of the engine ENG, the output of the first motor MG1 and the second motor MG2 by controlling the power converter 11, and the state of the clutch CL.

Further, the controller 20 is configured to control charge and discharge of the battery BAT. For example, the controller 20 sets an upper limit (charging power upper limit $TW_{IN\_now}$ to be described later) on charging power, which is power for charging the battery BAT, and performs control to prevent charging power exceeding the upper limit from being supplied to the battery BAT during charge of the battery BAT. The controller 20 may set an upper limit on discharging power, which is power discharged from the battery BAT, and may perform control to prevent discharging power exceeding the upper limit from being discharged from the battery BAT during discharge of the battery BAT. Specific examples of charge control of the battery BAT by the controller 20 will be described later.

The controller 20 may be an electronic control unit (ECU) including, for example, processing circuitry configured to execute a variety of processing for controlling the vehicle 10, a memory configured to store a variety of information (data and programs) for controlling the vehicle 10, and an input/output device configured to control input and output of data between the inside and outside of the controller 20. The controller 20 may be a single ECU or a plurality of ECUs operable in cooperation with one another.

The vehicle power storage system 50 of the present embodiment includes the battery BAT, the various sensors 12 (specifically, the voltmeter 12*a* and the ammeter 12*b*), and the controller 20.

Driving Modes of Vehicle

Next, driving modes of the vehicle 10 will be described. The driving modes of the vehicle 10 includes an EV driving mode, a hybrid driving mode, and an engine driving mode, and the vehicle 10 travels in one of them under the control of the controller 20.

EV Driving Mode

The EV driving mode is a driving mode in which the vehicle 10 travels using the output of the first motor MG1 with only electric power from the battery BAT supplied to the first motor MG1.

Specifically, in the EV driving mode, the controller 20 causes the clutch CL to be in the disconnected state and cuts the fuel supply off from the engine ENG (fuel cut oft) to stops the engine ENG from outputting power. Therefore, in the EV driving mode, the second motor MG2 does not generate electric power. The controller 20 causes the first motor MG1 to be supplied with only the electric power of the battery BAT, and the vehicle 10 travels using the output of the first motor MG1.

The controller 20 permits the vehicle 10 to travel in the EV driving mode on the condition that driving force (hereinafter, also referred to as "required driving force") required for traveling of the vehicle 10 is obtainable from the output of the first motor MG1 with only electric power from the battery BAT supplied to the first motor MG1.

Hybrid Driving Mode

The hybrid driving mode is a driving mode in which the vehicle 10 travels mainly using the output of the first motor MG1 with at least electric power generated by the second motor MG2 supplied to the first motor MG1.

Specifically, in the hybrid driving mode, the controller 20 causes the clutch CL to be in the disconnected state, allows the fuel supply to the engine ENG to cause the engine ENG to output power, and causes the second motor MG2 to be driven by the power of the engine ENG. Therefore, in the hybrid driving mode, the second motor MG2 generates electric power. The controller 20 disconnects the power transmission path by releasing the clutch CL and causes the first motor MG1 to be supplied with the electric power generated by the second motor MG2, and the vehicle 10 travels using the output of the first motor MG1.

The electric power supplied from the second motor MG2 to the first motor MG1 is larger than that supplied from the battery BAT to the first motor MG1. Therefore, the output of the first motor MG1 in the hybrid driving mode is larger than in the EV driving mode, and larger driving force (hereinafter, also referred to as "output of the vehicle 10") for traveling of the vehicle 10 is obtainable.

In addition, the controller 20 may cause the electric power of the battery BAT to be supplied to the first motor MG1 as necessary in the hybrid driving mode. That is, in the hybrid driving mode, the controller 20 may supply the first motor MG1 with electric power of both the second motor MG2 and the battery BAT. In this case, as compared to a case in which the first motor MG1 is supplied with only the electric power of the second motor MG2, the electric power supplied to the first motor MG1 can be increased, and even larger driving force is obtainable.

Engine Driving Mode

The engine driving mode is a driving mode in which the vehicle 10 travels mainly using the output of the engine ENG.

Specifically, in the engine driving mode, the controller 20 causes the clutch CL to be in the connected state and allows the fuel supply to the engine ENG to cause the engine ENG to output power. Since the power transmission path is formed by engaging the clutch CL, the power of the engine ENG is transmitted to the drive wheels DW to drive the drive wheels DW. Accordingly, in the engine driving mode, the controller 20 causes the engine ENG to output power, and the vehicle 10 travels using the power.

In addition, the controller 20 may cause the electric power of the battery BAT to be supplied to the first motor MG1 as necessary in the engine driving mode. In this case, as compared to a case in which the vehicle 10 travels using only the power of the engine ENG, the vehicle 10 can also use the power of the first motor MG1 by supplying the electric power of the battery BAT to the first motor MG1, and larger driving force is obtainable. Further, since the output of the engine ENG can be reduced, fuel efficiency of the vehicle 10 can be enhanced.

Functional Configuration of Controller

Next, a functional configuration of the controller 20 will be described. As shown in FIG. 1, the controller 20 functionally includes, for example, a first calculation unit 21, a second calculation unit 22, and a charge control unit 23, which are implemented by the processing circuitry of the controller 20 executing programs stored in the memory of the controller 20.

The first calculation unit 21 is configured to calculate estimated internal resistance $R_{now}$, which is an estimated value of present internal resistance of the battery BAT, based on the voltage V of the battery BAT measured by the voltmeter 12*a* and the current I of the battery BAT measured by the ammeter 12*b*. Any method may be employed for the calculation of the estimated internal resistance $R_{now}$. For example, the estimated internal resistance $R_{now}$ can be calculated by dividing voltage $V_{now}$, which is the present voltage V of the battery BAT, by current $I_{now}$, which is the present current I of the battery BAT. The first calculation unit 21 may calculate the estimated internal resistance $R_{now}$ based on voltage V and current I that were measured in the past in addition to the voltage $V_{now}$ and the current $I_{now}$, which are present values.

The second calculation unit 22 is configured to calculate the charging power upper limit $TW_{IN\_now}$, which is an upper limit on the charging power, based on the estimated internal resistance $R_{now}$ calculated by the first calculation unit 21, the voltage $V_{now}$, and the current $I_{now}$. The charging power upper limit $TW_{IN\_now}$ is power such that the voltage V reaches a voltage upper limit $V_{H\_limit}$ when the battery BAT is charged on the assumption that internal resistance of the battery BAT is equal to the estimated internal resistance $R_{now}$. The voltage upper limit $V_{H\_limit}$ is a predetermined value. The second calculation unit 22 may calculate the charging power upper limit $TW_{IN\_now}$, for example, from the following equation (1).

Equation 1

$$TW_{IN\_now} = V_{H\_limit}\left(\frac{V_{H\_limit} - V_{now}}{R_{now}} + I_{now}\right) \quad (1)$$

The charge control unit 23 is configured to control charge of the battery BAT to prevent charging power exceeding the charging power upper limit $TW_{IN\_now}$ calculated by the second calculation unit 22 from being supplied to the battery BAT. The charging power can be controlled, for example, by controlling the power converter 11.

For example, the first calculation unit 21 calculates the estimated internal resistance $R_{now}$ at predetermined intervals (for example, at 1-second intervals), and the second calculation unit 22 calculates the charging power upper limit $TW_{IN\_now}$ each time the voltage $V_{now}$ and/or the current $I_{now}$ is obtained or each time the estimated internal resistance $R_{now}$ is calculated. The charge control unit 23 controls charge of the battery BAT based on charging power upper limit $TW_{IN\_now}$ basically that has been calculated most recently by the second calculation unit 22. Accordingly, it becomes possible to control charge of the battery BAT based on the charging power upper limit $TW_{IN\_now}$ reflecting a present state (such as state of charge, state of health, and temperature) of the battery BAT, enabling appropriate control of the charging power.

On the other hand, power fluctuation (hereinafter, also referred to "prescribed power fluctuation") in which output power of the battery BAT fluctuates greatly within a short period of time may occur in the vehicle 10 due to a driving state or the like. During prescribed power fluctuation, the internal resistance of the battery BAT exhibits behavior (hereinafter, also referred to as "low-resistance response behavior") in which it temporarily decreases. If the charging power upper limit $TW_{IN\_now}$ is calculated based on internal resistance of the battery BAT that has been temporarily decreased in prescribed power fluctuation, the charging power upper limit $TW_{IN\_now}$ may exceed a proper value to be adopted. If the charging power upper limit $TW_{IN\_now}$ exceeds the proper value, the battery BAT cannot be protected from being supplied with excessive charging power and may be deteriorate due to the excessive charging power.

Figure 2:
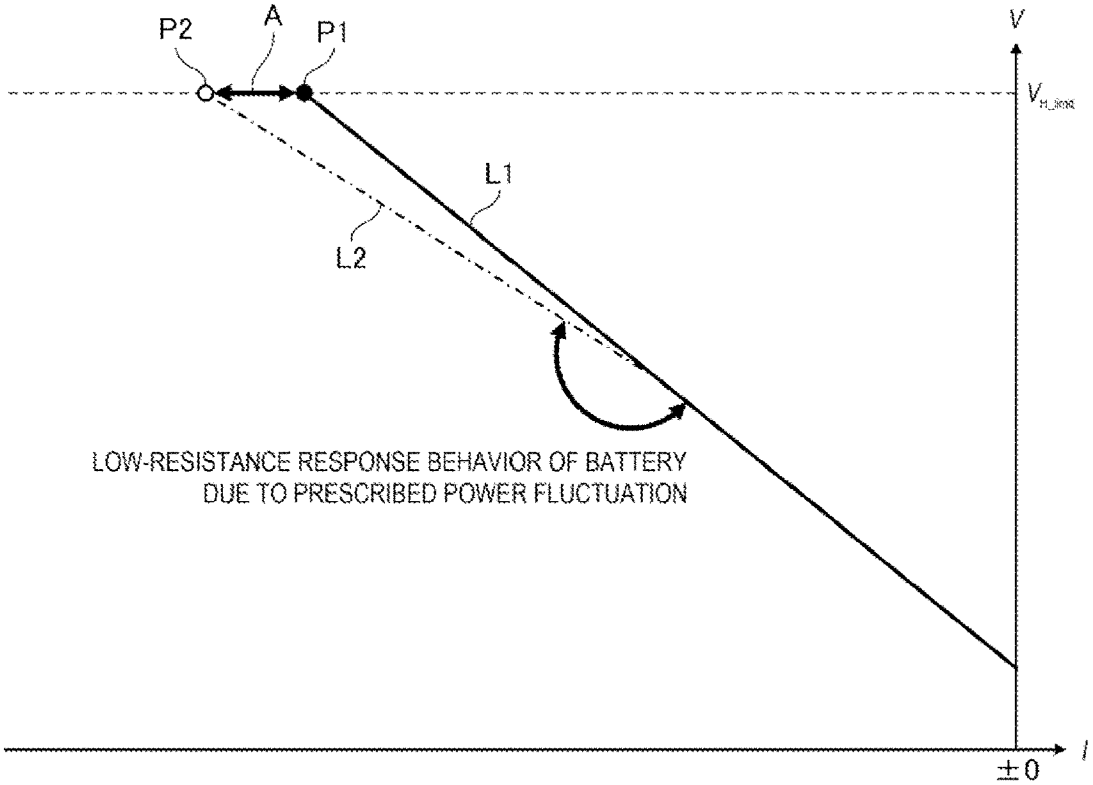
FIG. 2 shows a case in which a charging power upper limit $TW_{IN\_now}$ exceeds a proper value due to low-resistance response behavior of a battery BAT in the vehicle power storage system 50.

With reference to FIG. 2, a case in which the charging power upper limit $TW_{IN\_now}$ exceeds the proper value due to low-resistance response behavior of the battery BAT will be explained. In FIG. 2, the vertical axis represents the voltage V of the battery BAT, and the horizontal axis represents the current I of the battery BAT.

In FIG. 2, the point P1 represents the charging power upper limit $TW_{IN\_now}$ calculated immediately before prescribed power fluctuation. That is, the point P1 is an intersection of the solid line L1, whose slope corresponds to the estimated internal resistance $R_{now}$ calculated immediately before the prescribed power fluctuation, with the broken line representing the voltage upper limit $V_{H\_limit}$.

When prescribed power fluctuation occurs, the estimated internal resistance $R_{now}$ decreases as low-resistance response behavior of the battery BAT. If the estimated internal resistance $R_{now}$ calculated during the prescribed power fluctuation corresponds to the slope of the dash-dotted line L2 in FIG. 2, the charging power upper limit $TW_{IN\_now}$ calculated based on that becomes the point P2 in FIG. 2, which is an intersection of the dash-dotted line L2 with the broken line representing the voltage upper limit $V_{H\_limit}$.

Therefore, if the estimated internal resistance $R_{now}$ corresponding to the slope of the dash-dotted line L2 is used in the calculation of the charging power upper limit $TW_{IN\_now}$, the calculated charging power upper limit $TW_{IN\_now}$ increases as shown by the arrow A in FIG. 2.

Next, another case in which the charging power upper limit $TW_{IN\_now}$ exceeds the proper value will be described with reference to FIG. 3. In the following, descriptions common to those of FIG. 2 will be omitted or simplified as appropriate.

Figure 3:
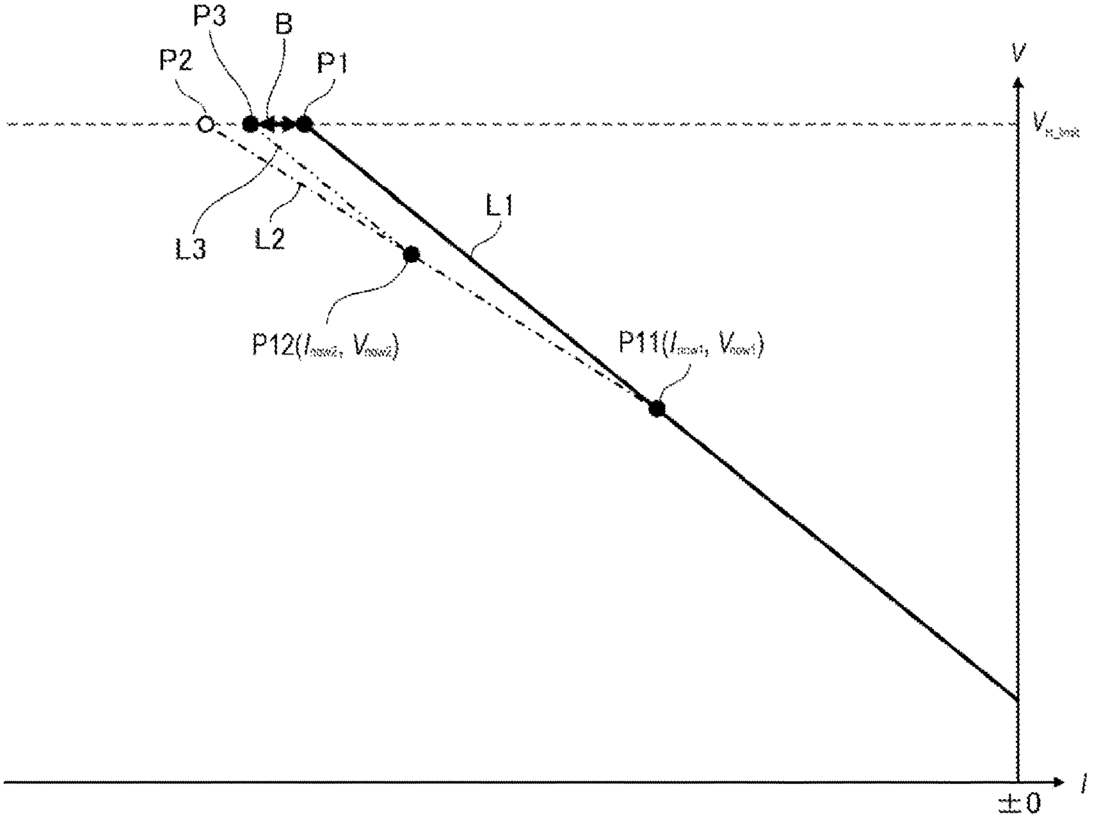
FIG. 3 shows another case in which the charging power upper limit $TW_{IN\_now}$ exceeds the proper value.

In FIG. 3, the point P11 represents power corresponding to current $I_{now}$ (hereinafter, also referred to as "current $I_{now1}$") and voltage $V_{now}$ (hereinafter, also referred to as "voltage $V_{now1}$") that are calculated immediately before prescribed power fluctuation, the point P12 represents power corresponding to current $I_{now}$ (hereinafter, also referred to as "current $I_{now2}$") and voltage $V_{now}$ (hereinafter, also referred to as "voltage $V_{now2}$") that are calculated during the prescribed power fluctuation, and the point P3 is an intersection of the dash-dot-dotted line L3, whose slope is equal to that of the solid line L1 and which passes through the point P12, with the broken line representing the upper limit voltage $V_{H\_limit}$.

As shown in FIG. 3, if the current $I_{now2}$ and the voltage $V_{now2}$, which are calculated during the prescribed power fluctuation, are used in the calculation of the charging power upper limit $TW_{IN\_now}$, even if the estimated internal resistance $R_{now}$ corresponding to the slope of the solid line L1 is used, the calculated charging power upper limit $TW_{IN\_now}$ increases as shown by the arrow B in FIG. 3.

In order to avoid controlling charge of the battery BAT based on charging power upper limit $TW_{IN\_now}$ (corresponding to, for example, the point P2 in FIG. 2 or the point P3 in FIG. 3) exceeding a proper value (corresponding to, for example, the point P1 in FIG. 2) due to low-resistance response behavior of the battery BAT as described with reference to FIGS. 2 and 3, the controller 20 further includes a limitation unit 24.

The limitation unit 24 is configured to determine whether prescribed power fluctuation has occurred or not based on the current I of the battery BAT and to prohibit the second calculation unit 22 from operating if it is determined that the prescribed power fluctuation has occurred. Prohibiting the second calculation unit 22 from operating refers to, for example, stopping operation of the second calculation unit 22, that is, stopping the calculation of the charging power upper limit $TW_{IN\_now}$ based on the estimated internal resistance $R_{now}$, the voltage $V_{now}$, and the current $I_{now}$.

The limitation unit 24 is configured to determine that the prescribed power fluctuation has occurred, for example, when a fluctuation ΔI (hereinafter, also referred to as a "current fluctuation") in the current I over a past predetermined period exceeds a predetermined threshold. Specifically, the limitation unit 24 (that is, the controller 20) may acquire the current I measured by the ammeter 12*b* at predetermined intervals (for example, at 1-second intervals) and may calculate difference between the present current I (that is, the current $I_{now}$) and the previous current I as the current fluctuation ΔI. If the current fluctuation ΔI exceeds the threshold, the limitation unit 24 may determine that prescribed power fluctuation has occurred and may prohibit the second calculation unit 22 from operating. On the other hand, if the current fluctuation ΔI remains within the threshold, the limitation unit 24 may determine that the prescribed power fluctuation has not occurred and may let the second calculation unit 22 operate.

In addition, the limitation unit 24 may calculate, based on a fluctuation (that is, the current fluctuation ΔI) in the current I over a past predetermined period and a fluctuation ΔV (hereinafter, also referred to as a "voltage fluctuation") in the voltage V in that period (that is, the past predetermined period), instantaneous resistance R', which is estimated internal resistance of the battery BAT in that period, and may determine that prescribed power fluctuation occurs when a ratio of the instantaneous resistance R' to the estimated internal resistance $R_{now}$ is below a predetermined threshold.

That is, the instantaneous resistance R' calculated during prescribed power fluctuation is smaller than that calculated when the prescribed power fluctuation has not occurred. Therefore, the ratio calculated by dividing the instantaneous resistance R' by the estimated internal resistance $R_{now}$ during the prescribed fluctuation is also smaller than that when the prescribed power fluctuation has not occurred. Using this characteristic of the ratio, it becomes possible to determine whether prescribed power fluctuation has occurred accurately by comparing the ratio with the threshold.

Specifically, the limitation unit 24 may acquire the current $R_{now}$ measured by the ammeter 12*b* and the voltage V measured by the voltage sensor 12*a* at predetermined intervals (for example, at 1-second intervals). The limitation unit 24 may calculate the current fluctuation ΔI similarly to the above and a difference between the present voltage V (that is, the voltage $V_{now}$) and the previous voltage V as the voltage fluctuation ΔV. Then, the limitation unit 24 may calculate the quotient of the voltage fluctuation ΔV divided by the current fluctuation ΔI as the instantaneous resistance R' and may further calculate the quotient of the instantaneous resistance R' divided by the estimated internal resistance $R_{now}$ as the ratio.

The instantaneous resistance R' calculated during prescribed power fluctuation is smaller than that calculated when the prescribed power fluctuation has not occurred. Therefore, the ratio calculated by dividing the instantaneous resistance R' by the estimated internal resistance $R_{now}$ during the power fluctuation is also smaller than that when the prescribed power fluctuation has not occurred. Using this characteristic, for example, the limitation unit 24 may determine that prescribed power fluctuation has occurred and may prohibit the second calculation unit 22 from operating when the calculated ratio is below the threshold. On the other hand, if the calculated ratio is larger than the threshold, the limitation unit 24 may determine that the prescribed power fluctuation has not occurred and may let the second calculation unit 22 operate.

If operation of the second calculation unit 22 is not prohibited by the limitation unit 24, the charge control unit 23 controls charge of the battery BAT, based on the charging power upper limit $TW_{IN\_now}$ calculated by the second calculation unit 22, based on the estimated internal resistance $R_{now}$, the voltage $V_{now}$, and the current $I_{now}$. Accordingly, it becomes possible to control charge of the battery BAT based on the charging power upper limit $TW_{IN\_now}$ reflecting the present state of the battery BAT, enabling appropriate control of the charging power.

On the other hand, when the operation of the second calculation unit 22 is prohibited by the limitation unit 24, the charge control unit 23 controls the charge of the battery BAT, for example, based on the charging power upper limit $TW_{IN\_now}$ calculated immediately before the operation of the second calculation unit 22 is prohibited (that is, the charging power upper limit $TW_{IN\_now}$ calculated most recently). Accordingly, it becomes possible to prevent the controller 20 from controlling charge of the battery BAT based on the charging power upper limit $TW_{IN\_now}$ reflecting the internal resistance of the battery BAT that has decreased temporarily due to prescribed power fluctuation, or the charging power upper limit $TW_{IN\_now}$ exceeding a proper value. Therefore, even if prescribed power fluctuation occurs in the battery BAT, charging power for the battery BAT can be appropriately controlled, and the battery BAT can be protected from excessive charging power.

In addition, when the operation of the second calculation unit 22 is prohibited by the limitation unit 24, the charge control unit 23 controls the charge of the battery BAT, based on the charging power upper limit $TW_{IN\_now}$ calculated most recently, which has already been calculated. Therefore, a processing load on the controller 20 can be reduced since extra calculation of the charging power upper limit $TW_{IN\_now}$ is unnecessary.

In addition, the limitation unit 24 is configured to determine that prescribed power fluctuation has occurred, for example, when the current fluctuation ΔI exceeds the threshold. Therefore, it becomes possible to accurately determine whether the prescribed power fluctuation has occurred or not, for example, based on the magnitude of the current fluctuation ΔI with a simple configuration using the ammeter 12*b* without an extra sensor for detecting the prescribed power fluctuation.

The limitation unit 24 may determine that prescribed power fluctuation has occurred when the ratio of the instantaneous resistance R' calculated by dividing the voltage fluctuation ΔV by the current fluctuation ΔI to the estimated internal resistance $R_{now}$ is below a threshold. Therefore, it becomes possible to accurately determine whether the prescribed power fluctuation has occurred or not, for example, based on the magnitude of the ratio with a simple configuration using the voltmeter 12*a* and the ammeter 12*b* without an extra sensor for detecting the prescribed power fluctuation.

As described above, by the limitation unit 24 prohibiting the second calculation unit 22 from operating when prescribed power fluctuation has occurred, the controller 20 can appropriately control charging power for the battery BAT even if the prescribed power fluctuation occurs. Although an example has been described above in which the controller 20 controls charge of the battery BAT, the present disclosure is not limited thereto. The controller 20 may be configured to control discharge of the battery BAT.

If the controller 20 controls the discharge of the battery BAT, the second calculation unit 22 of the controller 20 calculates, a discharging power upper limit, which is an upper limit on the discharging power for the battery BAT, based on the estimated internal resistance $R_{now}$ calculated by the first calculation unit 21, the voltage $V_{now}$, and the current $I_{now}$. The discharging power upper limit is power such that the voltage V of the battery BAT reaches a voltage lower limit $V_{L\_limit}$ when the battery BAT is discharged on the assumption that the internal resistance of the battery BAT is equal to the estimated internal resistance $R_{now}$. The voltage lower limit $V_{L\_limit}$ is a predetermined value. The second calculation unit 22 may calculate the discharging power upper limit value, for example, from the right side of the equation in which $V_{H\_limit}$ in the above equation (1) is replaced with $V_{L\_limit}$.

If the controller 20 controls the discharge of the battery BAT, the controller 20 includes a discharge control unit, instead of or in addition to the charge control unit 23 described above. The discharge control unit is configured to control discharge of the battery BAT to prevent discharging power exceeding the discharging power upper limit calculated by the second calculation unit 22 is from being discharged from the battery BAT. The discharging power can be controlled, for example, by controlling the power converter 11.

If the controller 20 controls the discharge of the battery BAT, the limitation unit 24 determines whether prescribed power fluctuation has occurred or not based on current I (for example, the current fluctuation ΔI or the instantaneous resistance R') of the battery BAT and prohibits the second calculation unit 22 from operating when it is determined that the prescribed power fluctuation has occurred. On the other hand, the limitation unit 24 does not prohibit the second calculation unit 22 from operating when it is determined that the prescribed power fluctuation has not occurred.

When operation of the second calculation unit 22 is not prohibited by the limitation unit 24, the discharge control unit of the controller 20 controls discharge of the battery BAT, based on the discharging power upper limit calculated by the second calculation unit 22, based on the estimated internal resistance $R_{now}$, the voltage $V_{now}$, and the current $I_{now}$. On the other hand, when the operation of the second calculation unit 22 is prohibited by the limitation unit 24, the discharge control unit controls discharge of the battery BAT, for example, based on the discharging power upper limit calculated immediately before the operation of the second calculation unit 22 is prohibited (that is, the discharging power upper limit calculated most recently). Accordingly, the controller 20 can appropriately control the discharging power discharged from the battery BAT even if prescribed power fluctuation occurs in the battery BAT. Therefore, it becomes possible to maintain performance of the battery BAT by preventing deterioration of the battery BAT, for example, due to excessive discharging power being discharged from the battery BAT.

Although some embodiments of the present disclosure have been described above, the present disclosure is not limited thereto. Modifications, improvements, and the like can be made as appropriate.

Although the vehicle power storage system 50 is installed in the vehicle 10 that is a hybrid electric vehicle in the above, the present disclosure is not limited thereto. The vehicle 10, in which the vehicle power storage system 50 is installed, may be, for example, an electric vehicle (such as a battery electric vehicle) or a fuel cell electric vehicle.

In the present specification, at least the following are described. The present disclosure is not limited to elements or the like in parentheses.

(1) A power storage system (vehicle power storage system 50) including:
- a battery (BAT);
- a voltmeter (12*a*) configured to measure voltage (V) of the battery (BAT);
- an ammeter (12*b*) configured to measure current (I) of the battery (BAT); and
- a controller (20), in which
- the controller (20) includes:
  - a first calculation unit (21) configured to calculate estimated internal resistance ($R_{now}$), which is an estimated value of present internal resistance of the battery (BAT), based on the voltage (V, $V_{now}$) measured by the voltmeter (12*a*) and the current (I, $I_{now}$) measured by the ammeter (12*b*);
  - a second calculation unit (22) configured to calculate charging power upper limit ($TW_{IN\_now}$), which is an upper limit on charging power for the battery (BAT), based on the estimated internal resistance ($R_{now}$) calculated by the first calculation unit (21), the present voltage ($V_{now}$), and the present current ($I_{now}$); and
  - a charge control unit (23) configured to control charge of the battery (BAT) to prevent charging power exceeding the charging power upper limit ($TW_{IN\_now}$) from being supplied to the battery (BAT), and
- the controller (20) further includes a limitation unit (24) configured to determine, based on the current (I), whether power fluctuation in which output power of the battery (BAT) fluctuates greatly within a short period of time has occurred or not and to prohibit the second calculation unit (22) from operating when the limitation unit (24) determines that the power fluctuation has occurred.

According to (1), operation of the second calculation unit is prohibited when it is determined that power fluctuation in which the output power of the battery fluctuates greatly within a short period of time has occurred. Therefore, it becomes possible to prevent the battery from being charged based on the charging power upper limit reflecting the internal resistance of the battery that has decreased temporarily due to the power fluctuation, or the charging power upper limit exceeding a proper value to be adopted. Accordingly, even if the power fluctuation occurs, it is possible to appropriately control the charging power for the battery.

(2) The power storage system (vehicle power storage system 50) according to (1), in which
- the limitation unit (24) is configured to determine that the power fluctuation has occurred when a fluctuation (ΔI) in the current (I) over a past predetermined period exceeds a threshold.

According to (2), it becomes possible to accurately determine whether the prescribed power fluctuation has occurred or not with a simple configuration using the ammeter without an extra sensor for detecting the prescribed power fluctuation.

(3) The power storage system (vehicle power storage system 50) according to (1), in which
- the limitation unit (24) is configured to calculate instantaneous resistance (R'), which is estimated internal resistance of the battery (BAT) in a past predetermined period, based on a fluctuation ($\Delta I$) in the current (I) over the period and a fluctuation ($\Delta V$) in the voltage (V) over the period, and the limitation unit (24) is configured to determine that the power fluctuation has occurred when a ratio of the instantaneous resistance (R') to the estimated internal resistance ($R_{now}$) is below a threshold.

According to (3), it becomes possible to accurately determine whether the prescribed power fluctuation has occurred or not with a simple configuration using the voltmeter and the ammeter without an extra sensor for detecting the prescribed power fluctuation.

(4) The power storage system (vehicle power storage system 50) according to any one of (1) to (3), in which the charge control unit (23) is configured to control charge of the battery (BAT) based on:

when operation of the second calculation unit (22) is not prohibited by the limitation unit (24), the charging power upper limit ($TW_{IN\_now}$) calculated by the second calculation unit (22) based on the estimated internal resistance ($R_{now}$), the present voltage ($V_{now}$), and the present current ($I_{now}$), and when the operation of the second calculation unit (22) is prohibited by the limitation unit (24), the charging power upper limit ($TW_{IN\_now}$) calculated immediately before the operation of the second calculation unit (22) is prohibited.

According to (4), when the operation of the second calculation unit is not prohibited by the limitation unit, the charge of the battery can be controlled based on the charging power upper limit reflecting the present state of the battery, enabling appropriate control of the charging power for the battery BAT. On the other hand, when the operation of the second calculation unit is prohibited by the limitation unit, it becomes possible to prevent the battery from being charged based on the charging power upper limit reflecting the internal resistance of the battery that has decreased temporarily due to the prescribed power fluctuation.

(5) A power storage system (vehicle power storage system 50) including:

a battery (BAT);

a voltmeter (12*a*) configured to measure voltage (V) of the battery (BAT);

an ammeter (12*b*) configured to measure current (I) of the battery (BAT); and a controller (20), in which the controller (20) includes:

a first calculation unit (21) configured to calculate estimated internal resistance ($R_{now}$), which is an estimated value of present internal resistance of the battery (BAT), based on the voltage (V, $V_{now}$) measured by the voltmeter (12*a*) and the current (I, $I_{now}$) measured by the ammeter (12*b*);

a second calculation unit (22) configured to calculate discharging power upper limit, which is an upper limit on discharging power for the battery (BAT), based on the estimated internal resistance ($R_{now}$) calculated by the first calculation unit (21), the present voltage ($V_{now}$), and the present current ($I_{now}$); and a discharge control unit configured to control discharge of the battery (BAT) to prevent discharging power exceeding the discharging power upper limit from being discharged from the battery (BAT), and the controller (20) further includes a limitation unit (24) configured to determine, based on the current (I), whether power fluctuation in which output power of the battery (BAT) fluctuates greatly within a short period of time has occurred or not and to prohibit the second calculation unit (22) from operating when the limitation unit (24) determines that the power fluctuation has occurred.

According to (5), operation of the second calculation unit is prohibited when it is determined that power fluctuation in which the output power of the battery fluctuates greatly within a short period of time has occurred. Accordingly, even if the power fluctuation occurs, it is possible to appropriately control the discharging power for the battery.

What is claimed is:

1. A power storage system comprising:

a battery;

a voltmeter configured to measure voltage of the battery;

an ammeter configured to measure current of the battery; and processing circuitry, wherein the processing circuitry functionally includes:

a first calculation unit configured to calculate estimated internal resistance, which is an estimated value of present internal resistance of the battery, based on the voltage and the current;

a second calculation unit configured to calculate charging power upper limit, which is an upper limit on charging power for the battery, based on the estimated internal resistance calculated by the first calculation unit, the present voltage, and the present current;

a charge control unit configured to control charge of the battery to prevent charging power exceeding the charging power upper limit from being supplied to the battery; and a limitation unit configured to determine, based on the current, whether power fluctuation in which output power of the battery fluctuates greatly within a short period of time has occurred or not and to prohibit the second calculation unit from operating during the power fluctuation.

2. The power storage system according to claim 1, wherein the limitation unit is configured to determine that the power fluctuation has occurred when a fluctuation in the current over a past predetermined period exceeds a first threshold.

3. The power storage system according to claim 1, wherein the limitation unit is configured to calculate instantaneous resistance, which is estimated internal resistance of the battery in a past predetermined period, based on a fluctuation in the current over the period and a fluctuation in the voltage over the period, and the limitation unit is configured to determine that the power fluctuation has occurred when a ratio of the instantaneous resistance to the estimated internal resistance is below a second threshold.

4. The power storage system according to claim 1, wherein the charge control unit is configured to control charge of the battery based on:

when operation of the second calculation unit is not prohibited by the limitation unit, the charging power upper limit calculated by the second calculation unit based on the estimated internal resistance, the present voltage, and the present current; and when the operation of the second calculation unit is prohibited by the limitation unit, the charging power upper limit calculated immediately before the operation of the second calculation unit is prohibited.

5. The power storage system according to claim 2, wherein the charge control unit is configured to control charge of the battery based on:

when operation of the second calculation unit is not prohibited by the limitation unit, the charging power upper limit calculated by the second calculation unit based on the estimated internal resistance, the present voltage, and the present current; and when the operation of the second calculation unit is prohibited by the limitation unit, the charging power upper limit calculated immediately before the operation of the second calculation unit is prohibited.

6. The power storage system according to claim 3, wherein the charge control unit is configured to control charge of the battery based on:

when operation of the second calculation unit is not prohibited by the limitation unit, the charging power upper limit calculated by the second calculation unit based on the estimated internal resistance, the present voltage, and the present current; and when the operation of the second calculation unit is prohibited by the limitation unit, the charging power upper limit calculated immediately before the operation of the second calculation unit is prohibited.

7. A power storage system comprising:

a battery;

a voltmeter configured to measure voltage of the battery;

an ammeter configured to measure current of the battery; and processing circuitry, wherein the processing circuitry functionally includes:

a first calculation unit configured to calculate estimated internal resistance, which is an estimated value of present internal resistance of the battery, based on the voltage and the current;

a second calculation unit configured to calculate discharging power upper limit, which is an upper limit on discharging power for the battery, based on the estimated internal resistance calculated by the first calculation unit, the present voltage, and the present current;

a discharge control unit configured to control discharge of the battery to prevent discharging power exceeding the discharging power upper limit from being discharged from the battery; and a limitation unit configured to determine, based on the current, whether power fluctuation in which output power of the battery fluctuates greatly within a short period of time has occurred or not and to prohibit the second calculation unit from operating during the power fluctuation.

* * * * *